United States Patent
Otremba et al.

(10) Patent No.: US 8,766,430 B2
(45) Date of Patent: Jul. 1, 2014

(54) SEMICONDUCTOR MODULES AND METHODS OF FORMATION THEREOF

(75) Inventors: Ralf Otremba, Kaufbeuren (DE); Davide Chiola, Villach (AT); Erich Griebl, Dorfen (DE); Fabio Brucchi, Villach (AT)

(73) Assignee: Infineon Technologies AG, Neubiberg (DE)

( * ) Notice: Subject to any disclaimer, the term of this patent is extended or adjusted under 35 U.S.C. 154(b) by 145 days.

(21) Appl. No.: 13/517,654

(22) Filed: Jun. 14, 2012

(65) Prior Publication Data

US 2013/0334677 A1    Dec. 19, 2013

(51) Int. Cl.
    H01L 23/48    (2006.01)
(52) U.S. Cl.
    USPC ............... 257/697; 257/706; 257/E23.024; 257/E23.068
(58) Field of Classification Search
    USPC ............... 257/697, 706, E23.024, E23.068
    See application file for complete search history.

(56) References Cited

U.S. PATENT DOCUMENTS

| | | | |
|---|---|---|---|
| 3,404,214 A | 10/1968 | Elliott | |
| 4,722,441 A | 2/1988 | Arai et al. | |
| 5,998,227 A | 12/1999 | Pelly | |
| 6,055,148 A | 4/2000 | Grover | |
| 6,181,007 B1 | 1/2001 | Yamazaki et al. | |
| 7,208,818 B2 * | 4/2007 | Luo et al. | 257/666 |
| 7,443,014 B2 * | 10/2008 | Otremba | 257/676 |
| 7,737,548 B2 * | 6/2010 | Gomez | 257/706 |
| 8,067,841 B2 | 11/2011 | Heng et al. | |
| 2009/0127677 A1 * | 5/2009 | Gomez | 257/666 |
| 2010/0289127 A1 | 11/2010 | Kanazawa et al. | |

FOREIGN PATENT DOCUMENTS

| | | |
|---|---|---|
| DE | 19615112 A1 | 10/1997 |
| GB | 1180368 A | 2/1970 |
| GB | 2274738 A | 3/1994 |
| JP | 61055946 A | 3/1986 |
| JP | 2138766 A | 5/1990 |
| JP | 9009644 A | 1/1997 |
| JP | 9213960 A | 8/1997 |
| JP | 10189870 A | 7/1998 |
| JP | 11345935 A | 12/1999 |
| JP | 2009239299 A | 10/2009 |
| WO | WO 2009033891 A2 | 3/2009 |

OTHER PUBLICATIONS

Wojnowski, et al., "Package Trends for Today's and Future mm-Wave Applications," 38th European Mocrowave Conference, EuMIC 2008, Infineon, pp. 1-55.

* cited by examiner

Primary Examiner — Trung Q Dang
(74) Attorney, Agent, or Firm — Slater & Matsil, L.L.P.

(57) ABSTRACT

In accordance with an embodiment of the present invention, a semiconductor module includes a first semiconductor device having a first plurality of leads including a first gate/base lead, a first drain/collector lead, and a first source/emitter lead. The module further includes a second semiconductor device and a circuit board. The second semiconductor device has a second plurality of leads including a second gate/base lead, a second drain/collector lead, and a second source/emitter lead. The circuit board has a plurality of mounting holes, wherein each of the first plurality of leads and the second plurality of leads is mounted into a respective one of the plurality of mounting holes. At the plurality of mounting holes, a first distance from the first gate/base lead to the second gate/base lead is different from a second distance from the first source/emitter lead to the second source/emitter lead.

23 Claims, 13 Drawing Sheets

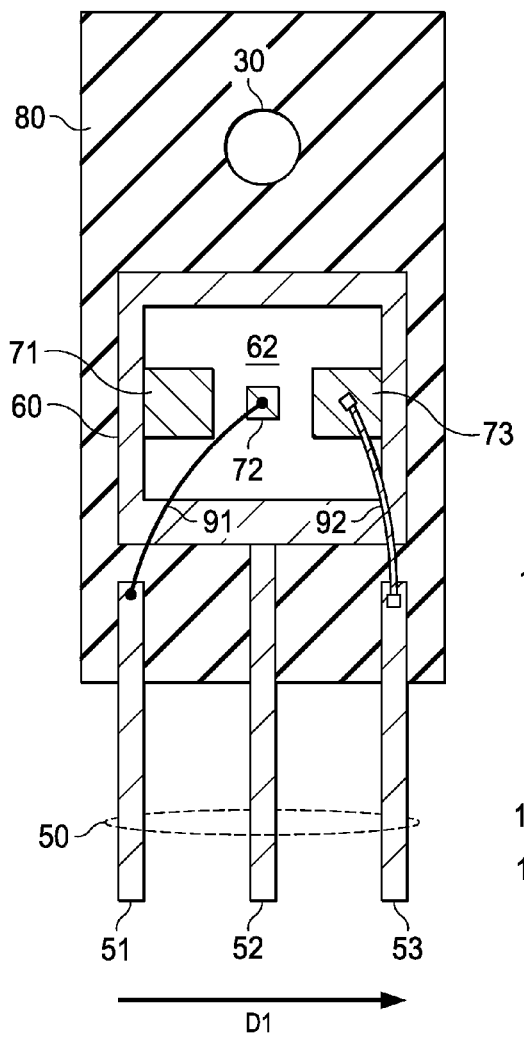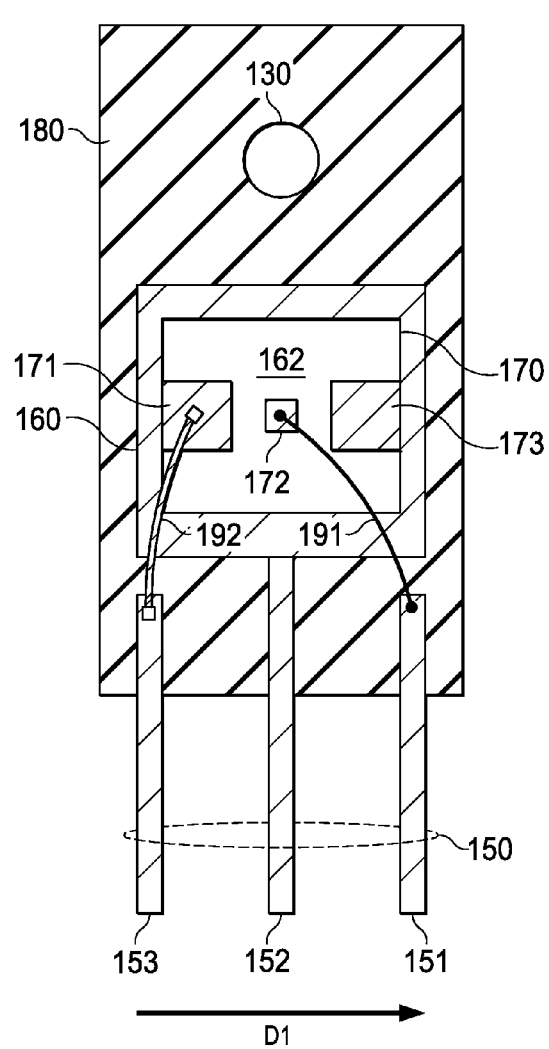

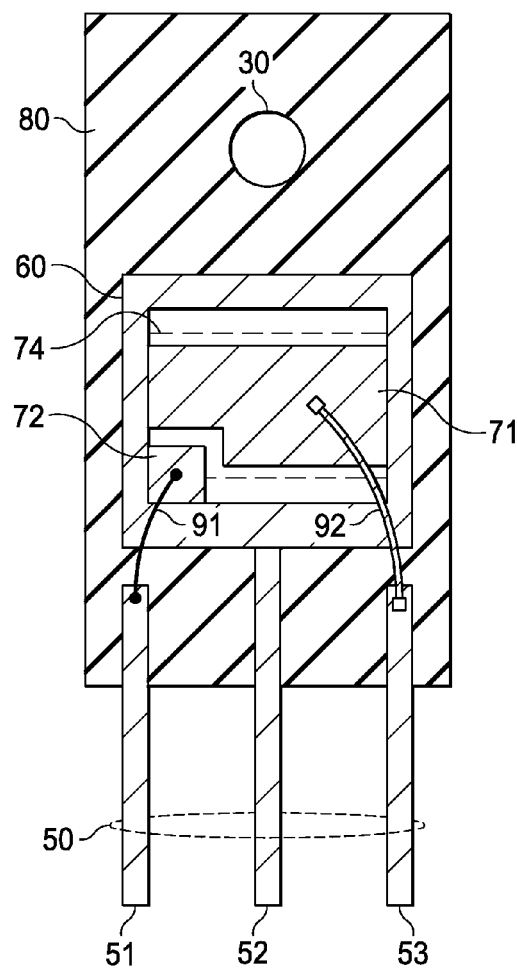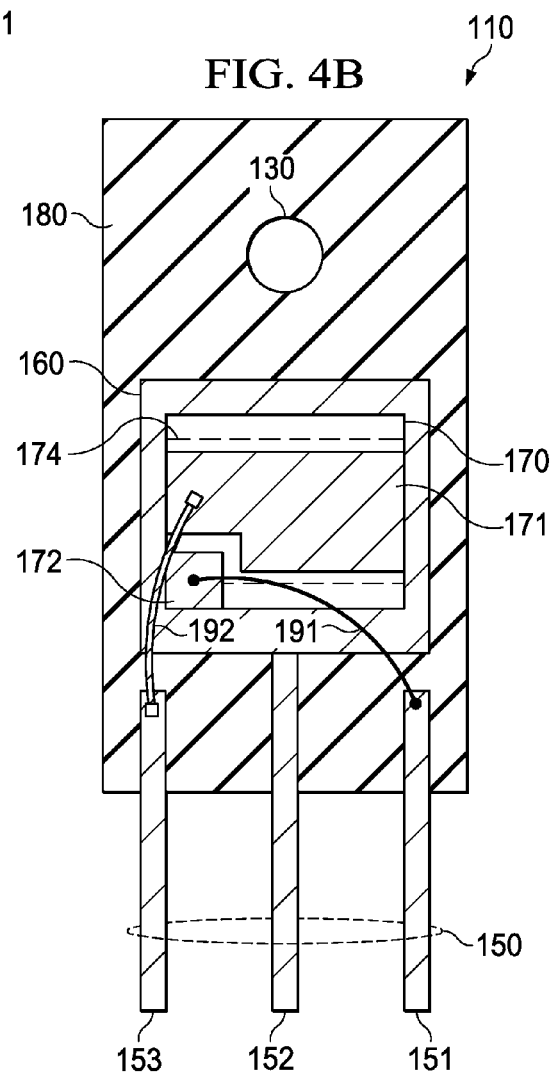

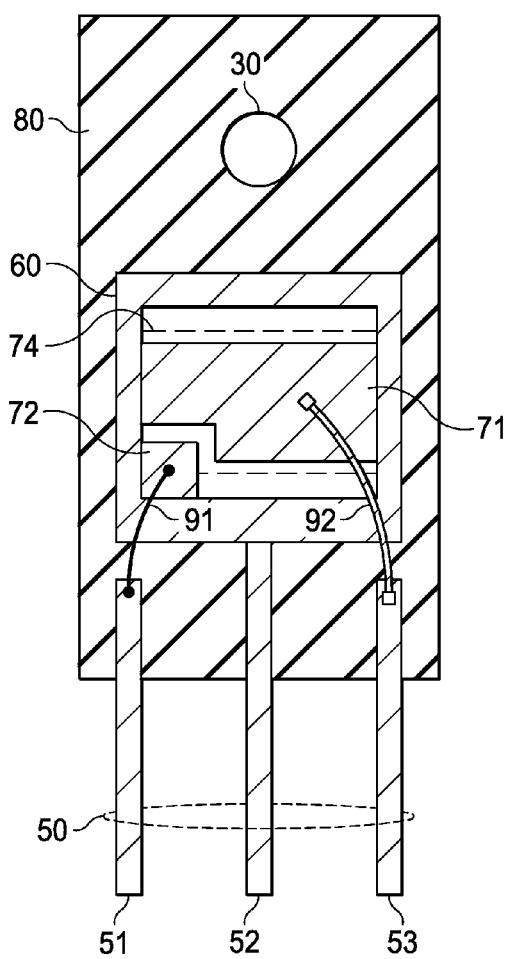
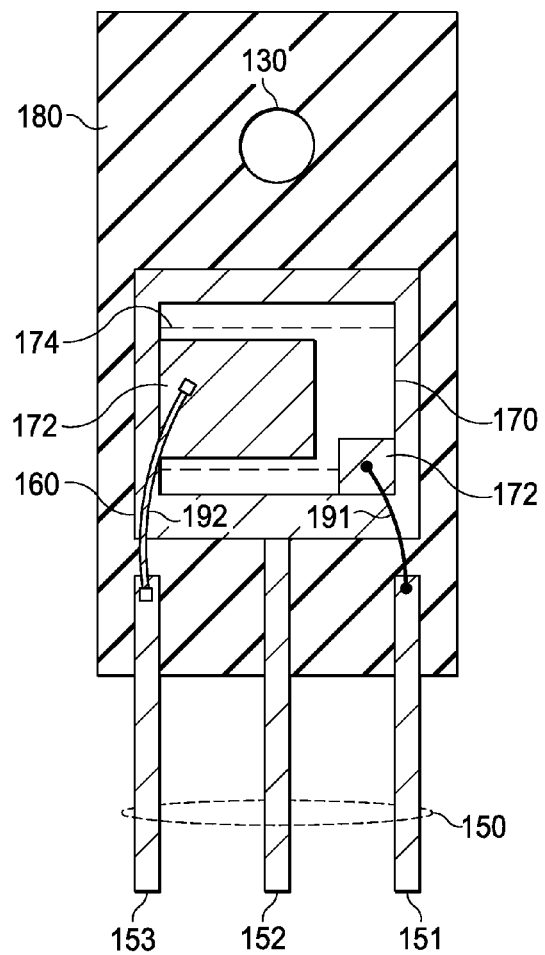

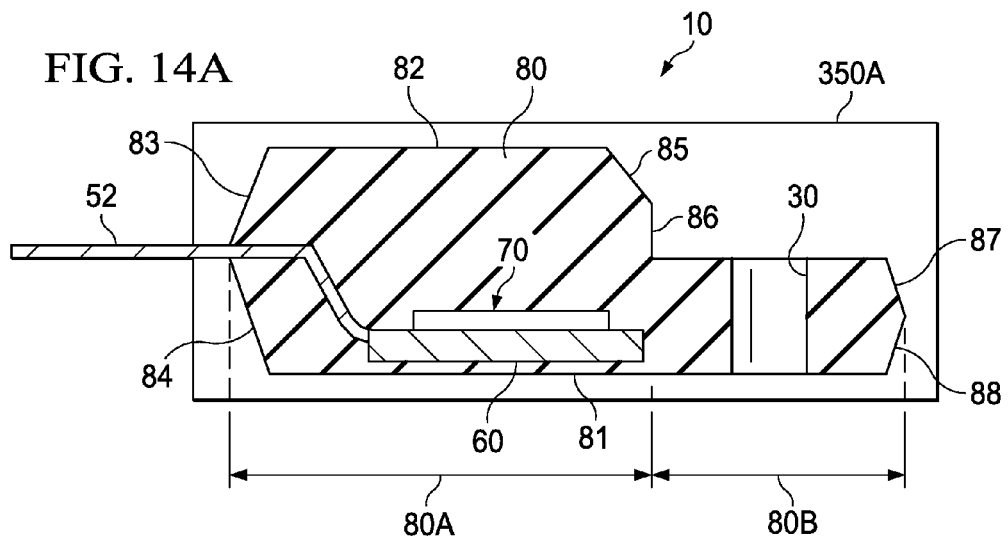
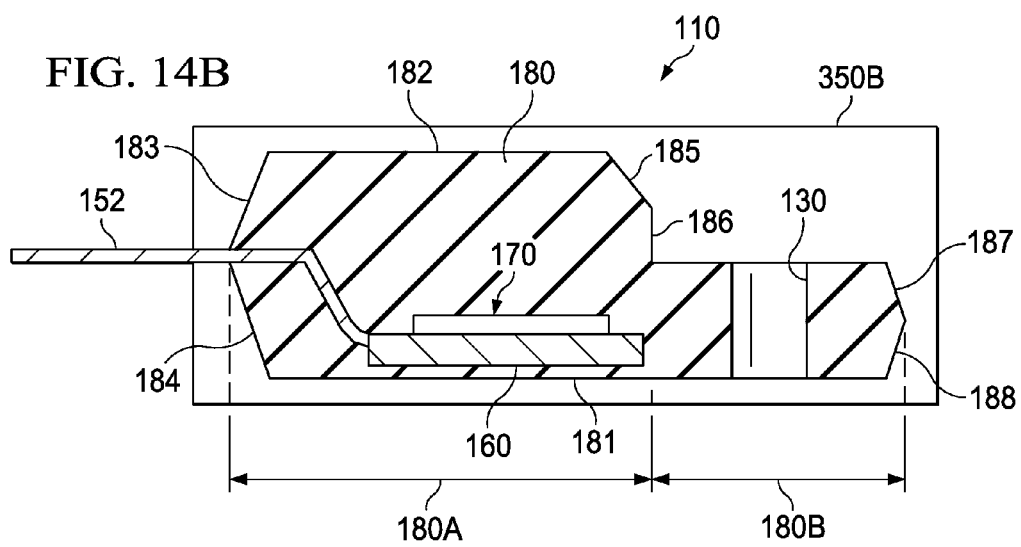

SEMICONDUCTOR MODULES AND METHODS OF FORMATION THEREOF

TECHNICAL FIELD

The present invention relates generally to electronic devices, and more particularly to semiconductor modules and methods of formation thereof.

BACKGROUND

Semiconductor devices are used in a variety of electronic and other applications. Semiconductor devices comprise integrated circuits or discrete devices that are formed on semiconductor wafers by depositing one or more types of thin films of material over the semiconductor wafers, and patterning the thin films of material to form the integrated circuits.

The semiconductor devices are typically packaged within a ceramic or a plastic body to protect the semiconductor devices from physical damage or corrosion. The packaging also supports the electrical contacts required to connect a semiconductor device, also referred to as a die or a chip, to other devices external to the packaging. Many different types of packaging are available depending on the type of semiconductor device and the intended use of the semiconductor device being packaged. Typical packaging features, such as dimensions of the package, pin count, etc., may comply with open standards from Joint Electron Devices Engineering Council (JEDEC), among others. Packaging may also be referred as semiconductor device assembly or simply assembly.

Packaging may be a cost intensive process because of the complexity of connecting multiple electrical connections to external pads while protecting these electrical connections and the underlying chip or chips.

SUMMARY OF THE INVENTION

These and other problems are generally solved or circumvented, and technical advantages are generally achieved, by illustrative embodiments of the present invention.

In accordance with an embodiment of the present invention, a semiconductor module comprises a first semiconductor device having a first plurality of leads including a first gate/base lead, a first drain/collector lead, and a first source/emitter lead. The module further comprises a second semiconductor device and a circuit board. The second semiconductor device has a second plurality of leads including a second gate/base lead, a second drain/collector lead, and a second source/emitter lead. The circuit board has a plurality of mounting holes, wherein each of the first plurality of leads and the second plurality of leads is mounted into a respective one of the plurality of mounting holes. At the plurality of mounting holes, a first distance from the first gate/base lead to the second gate/base lead is different from a second distance from the first source/emitter lead to the second source/emitter lead.

In accordance with an alternative embodiment of the present invention, a semiconductor module comprises a first semiconductor device comprising a first discrete component and having a first plurality of leads arranged in a first sequence. The first plurality of leads comprises a first gate/base lead. The module further comprises a second semiconductor device comprising a second discrete component and having a second plurality of leads arranged in a second sequence. The second plurality of leads comprises a second gate/base lead. A location of the first gate/base lead in the first sequence is different from a location of the second gate/base lead in the second sequence. The first semiconductor device and the second semiconductor device comprise substantially the same package dimensions.

In accordance with an alternative embodiment of the present invention, a semiconductor module comprises a first semiconductor device having a first plurality of leads and a second semiconductor device. The first semiconductor device has a heatsink side configured to mount a heatsink. The second semiconductor device has a second plurality of leads. The second semiconductor device has a heatsink side configured to mount a heatsink. The heatsink side of the first semiconductor device faces the heatsink side of the second semiconductor device.

In accordance with yet another embodiment of the present invention, a method of manufacturing semiconductor packages comprises providing a first semiconductor device comprising a first type of discrete component having a first gate/base contact region. A second semiconductor device comprising the first type of discrete component having a second gate/base contact region is provided. The first semiconductor device is placed over a first leadframe comprising a first lead and a second lead in a first sequence relative to a first reference frame of the first semiconductor device. The second semiconductor device is placed over a second leadframe comprising a first lead and a second lead in a second sequence relative to a second reference frame of the second semiconductor device. The first sequence is the same as the second sequence, and the first reference frame is the same as the second reference frame. The first gate/base contact region is coupled to the first lead of the first leadframe. The second gate/base contact region is coupled to the second lead of the second leadframe.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes

FIG. 2, which includes

FIG. 3, which includes FIGS. 3A and 3B, illustrates sectional top view of the semiconductor devices illustrated in FIG. 1 in accordance with embodiments of the invention;

FIG. 4, which includes FIGS. 4A-4D, illustrates sectional top view of the semiconductor devices illustrated in FIG. 1 in accordance with alternative embodiments of the invention;

FIG. 5, which includes FIGS. 5A and 5B, illustrates a semiconductor module in accordance with an embodiment of the invention, wherein FIG. 5A illustrates a projection view while FIG. 5B illustrates a sectional top view through a circuit board;

FIG. 6, which includes FIGS. 6A and 6B, illustrates a semiconductor module in accordance with an embodiment of the invention, wherein FIG. 6A illustrates a sectional side view while FIG. 6B illustrates a sectional top view through a circuit board;

FIG. 7, which includes FIGS. 7A and 7B, illustrates a semiconductor module in accordance with an embodiment of the invention, wherein FIG. 7A illustrates a side sectional view while FIG. 7B illustrates a sectional top view through a circuit board; and FIG. 8-15 illustrates various stages of fabricating a plurality of semiconductor devices in accordance with embodiments of the invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A structural embodiment of the present invention will be described using FIGS. 1-3. An alternative structural embodiment will be described using FIG. 4. An embodiment of the invention for assembling the semiconductor devices will be described using FIG. 5. Further embodiments of the invention for assembling the semiconductor devices will be described using FIG. 6-7. A method of fabricating the semiconductor devices will be described using FIGS. 8-15.

Figure 1A:
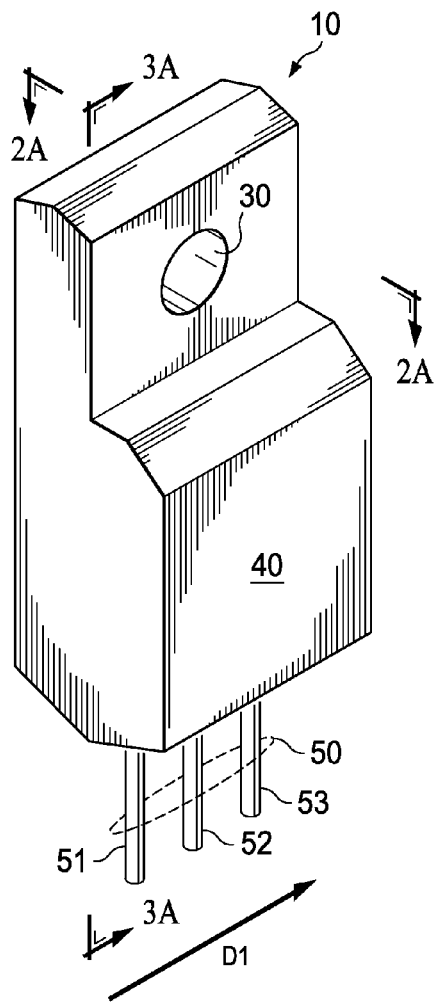
FIGS. 1A and 1B, illustrates projection views of semiconductor devices in accordance with an embodiment of the invention.
Figure 1B:
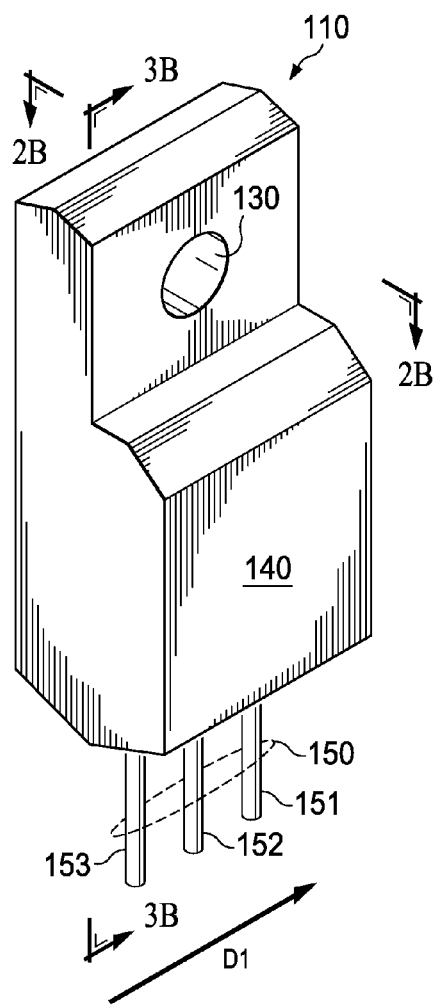
Figure 2A:
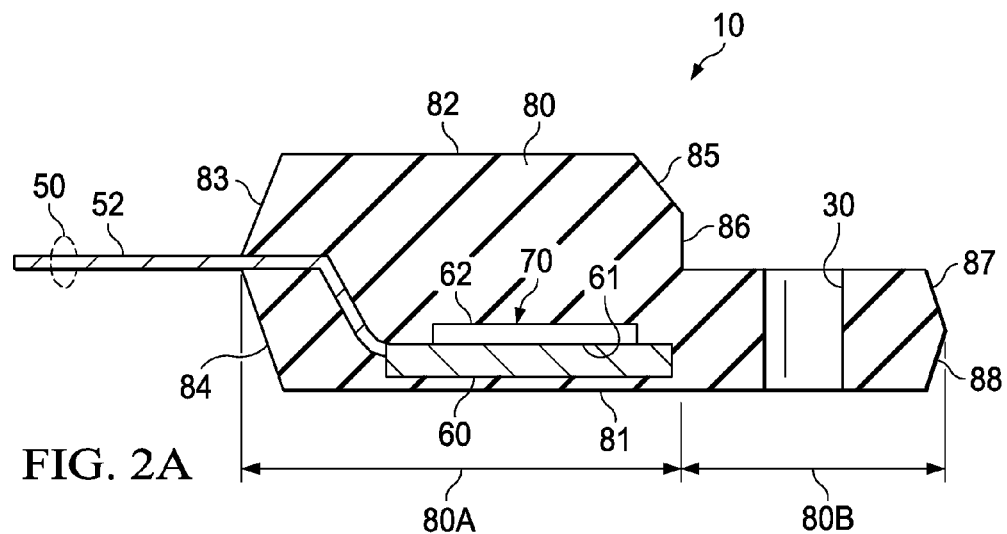
FIGS. 2A and 2B, illustrates cross-sectional side views of the semiconductor devices illustrated in FIG. 1 in accordance with embodiments of the invention.
Figure 2B:
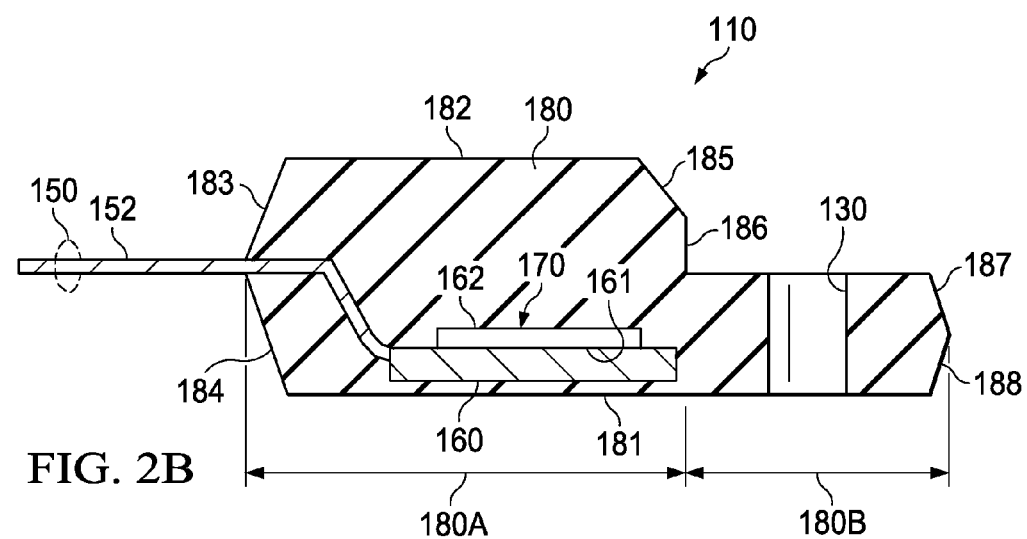

FIG. 1, which includes FIGS. 1A and 1B, illustrates semiconductor devices in accordance with an embodiment of the invention, wherein FIG. 1 illustrates a projection view. FIG. 2, which includes FIGS. 2A and 2B, illustrates cross-sectional side view of the semiconductor devices illustrated in FIG. 1 in accordance with an embodiment of the invention. FIG. 3, which includes FIGS. 3A and 3B, illustrates sectional top view of the semiconductor devices illustrated in FIG. 1 in accordance with an embodiment of the invention.

A first semiconductor device 10 is illustrated in FIG. 1A while a second semiconductor device 110 is illustrated in FIG. 1B.

The first semiconductor device 10 includes a first package 40 having a first plurality of leads 50 or pins extending out of the body of the first package 40 along one side of the package. The first plurality of leads 50 may comprise a number of leads in various embodiments depending on the package type. In one embodiment, the first plurality of leads 50 comprises a first gate/base lead 51, a first drain/collector lead 52, and a first source/emitter lead 53. The first package 40 includes a first opening 30 for securely mounting a heatsink underneath the first package 40.

The second semiconductor device 110 includes a second package 140 having a second plurality of leads 150 or pins extending out from one side of the body of the second package 140. The second plurality of leads 150 may comprise a number of leads in various embodiments depending on the package type. In one embodiment, the second plurality of leads 150 comprises a second gate/base lead 151, a second drain/collector lead 152, and a second source/emitter lead 153. The second package 140 includes a second opening 130 for securely mounting a heatsink underneath the second package 140.

As illustrated in FIGS. 1A and 1B, the first semiconductor device 10 and the second semiconductor device 110 differ from each other regarding the arrangement of leads. In particular, in one embodiment, the arrangement of leads in the second semiconductor device 110 is opposite to the arrangement of leads in the first semiconductor device 10.

In various embodiments, in contrast to the first semiconductor device 10, the second semiconductor device 110 has a different arrangement of pins or leads. In particular, in one or more embodiments, the arrangement of pins in the second semiconductor device 110 is opposite (mirror image) of the arrangement of pins in the first semiconductor device 10. For example, along a first direction D1, the first semiconductor device 10 has a pin sequence of the first gate/base lead 51, the first drain/collector lead 52, followed by the first source/emitter lead 53 while the second semiconductor device 110 has a pin sequence of the second source/emitter lead 153, the second drain/collector lead 152, and followed by the second gate/base lead 151. Embodiments of the invention also include other combinations as long as the first pin sequence is different from the second pin sequence. As another example, the first semiconductor device 10 has a pin sequence of the first gate/base lead 51, the first drain/collector lead 52, followed by the first source/emitter lead 53 while the second semiconductor device 110 has a pin sequence of the second source/emitter lead 153, the second gate/base lead 151, and followed by the second drain/collector lead 152.

FIG. 2, which includes FIGS. 2A and 2B, illustrates cross sectional side view of the semiconductor devices illustrated in FIG. 1 in accordance with an embodiment of the invention.

Referring to FIG. 2A, which is a sectional view of FIG. 1A, the first semiconductor device 10 comprises a first leadframe 60 disposed within a first encapsulant 80 in various embodiments. The first leadframe 60 includes a first plurality of leads 50. A first semiconductor chip 70 is disposed over a die attach or die paddle of the first leadframe 60. The first leadframe 60 couples to a first contact region disposed on a first side 61 of the first semiconductor chip 70. The opposite second side 62 of the first semiconductor chip 70 is covered with an encapsulant. The first encapsulant 80 has a first portion 80A and a second portion 80B. The first portion 80A is directly over the first semiconductor chip 70 while the second portion 80B is laterally adjacent the first semiconductor chip 70. The second portion 80B is directly away from the direction of the first plurality of leads 50 such that the first semiconductor chip 70 is disposed between the first plurality of leads 50 and the second portion 80B. As illustrated, the first portion 80A is thicker than the second portion 80B. A first opening 30 is disposed within the first encapsulant 80 in one or more embodiments. The first opening 30 is configured to enable mounting of a heatsink. For example, a heatsink may be attached to the first semiconductor device 10 using a screw mounted through the first opening 30.

Referring again to FIG. 2A, the first encapsulant 80 includes a first common major surface 81 for the first portion 80A and the second portion 80B, for example, for mounting a heatsink. The first common major surface 81 is planar to maximize heat dissipation from the first semiconductor chip 70 to the heatsink. The first portion 80A of the first encapsulant 80 includes a first major surface 82 disposed over the second side 62 of the first semiconductor chip 70. The first portion 80A comprises a first sidewall having a first sidewall portion 83 and a second sidewall portion 84 from which the first plurality of leads 50 extend out. As illustrated, the first sidewall portion 83 may be inclined relative to the second sidewall portion 84. The first portion 80A extends to the second portion 80B through a second sidewall comprising a first sidewall surface portion 85 and a second sidewall surface portion 86. Various embodiments may further include more sidewall surface portions.

Referring now to FIG. 2B, which is a sectional view of FIG. 1B, the second semiconductor device 110 comprises a second leadframe 160 disposed within a second encapsulant 180. The second leadframe 160 includes a second plurality of leads 150. A second semiconductor chip 170 is disposed over a die attach or die paddle of the second leadframe 160. The second leadframe 160 couples to a second contact region disposed on a first side 161 of the second semiconductor chip 170. The opposite second side 162 of the second semiconductor chip 170 is covered with a second encapsulant 180. The second encapsulant 180 has a first portion 180A and a second portion 180B. The first portion 180A is directly over the second semiconductor chip 170 while the second portion 180B is laterally adjacent the second semiconductor chip 170. The second portion 180B is directly away from the direction of the second plurality of leads 150 such that the second semiconductor chip 170 is disposed between the second plurality of leads 150 and the second portion 180B. As illustrated, the first portion 180A is thicker than the second portion 180B. A second opening 130 is disposed within the second encapsulant 180 in one or more embodiments. The second opening 130 is configured to enable mounting of a heatsink. For example, a heatsink may be attached to the second semiconductor device 110 using a screw mounted through the second opening 130.

Similarly, referring to FIG. 2B, the second encapsulant 180 includes a second common major surface 181 for the first portion 180A and the second portion 180B, for example, for mounting a heatsink. The second common major surface 181 is planar to maximize heat dissipation from the second semiconductor chip 170. The first portion 180A of the second encapsulant 180 includes a first major surface 182 disposed over the second side 162 of the second semiconductor chip 170. The first portion 180A comprises a first sidewall having a first sidewall portion 183 and a second sidewall portion 184 from which the second plurality of leads 150 extend out. As illustrated, the first sidewall portion 183 may be inclined relative to the second sidewall portion 184. The first portion 180A extends to the second portion 180B through a second sidewall comprising a first sidewall surface portion 185 and a second sidewall surface portion 186.

In various embodiments, the first semiconductor chip 70 and the second semiconductor chip 170 may be a power semiconductor device, which may be a discrete device in one embodiment. In one embodiment, the first semiconductor chip 70 and the second semiconductor chip 170 are a three terminal device such as a power metal insulator semiconductor field effect transistor (MISFET), a junction field effect transistor (JFET), bipolar junction transistor (BJT), an insulated gate bipolar transistor (IGBT), or a thyristor. In one or more embodiments, the first semiconductor chip 70 and the second semiconductor chip 170 are substantially identical devices having substantially similar electrical functionality, and substantially similar material and physical characteristics.

In various embodiments, the first semiconductor chip 70 and the second semiconductor chip 170 may comprise power chips, which, for example, draw large currents (e.g., greater than 30 amperes). In various embodiments, the first semiconductor chip 70 and the second semiconductor chip 170 are configured to operate at about 20 V to about 1000 V. In one embodiment, the first semiconductor chip 70 and the second semiconductor chip 170 are configured to operate at about 20 V to about 100 V. In one embodiment, the first semiconductor chip 70 and the second semiconductor chip 170 are configured to operate at about 100 V to about 500 V. In one embodiment, the first semiconductor chip 70 and the second semiconductor chip 170 are configured to operate at about 500 V to about 1000 V. In various embodiments, the first semiconductor chip 70 and the second semiconductor chip 170 are configured to operate at about 10 V to about 10,000 V.

In one embodiment, the first semiconductor chip 70 and the second semiconductor chip 170 are an n-channel MISFET. In another embodiment, the first semiconductor chip 70 and the second semiconductor chip 170 are a p-channel MISFET. In one or more embodiments, the first semiconductor chip 70 and the second semiconductor chip 170 may comprise a plurality of devices such as a vertical MISFET and a diode, or alternatively two MISFET devices separated by an isolation region.

The thickness of the first semiconductor chip 70 and the second semiconductor chip 170 from the first side 61 to the second side 62 may be less than 150 µm in various embodiments. The thickness of the first semiconductor chip 70 and the second semiconductor chip 170 from the first side 61 to the second side 62 may be less than 100 µm in various embodiments. The thickness of the first semiconductor chip 70 and the second semiconductor chip 170 from the first side 61 to the second side 62 may be less than 50 µm in various embodiments.

The thickness of the first semiconductor chip 70 and the second semiconductor chip 170 from the first side 61 to the second side 62 may be about 50 µm to about 150 µm in various embodiments. The thickness of the first semiconductor chip 70 and the second semiconductor chip 170 from the first side 61 to the second side 62 may be about 100 µm to about 150 µm in one embodiment. The thickness of the first semiconductor chip 70 and the second semiconductor chip 170 from the first side 61 to the second side 62 may be about 50 µm to about 100 µm in one embodiment.

FIG. 3, which includes FIGS. 3A and 3B, illustrates sectional top view of the semiconductor devices illustrated in FIG. 1 in accordance with an embodiment of the invention.

As illustrated in the top view of the first semiconductor device 10 illustrated in FIG. 3A, the first semiconductor chip 70 is disposed over a die paddle of a first leadframe 60. The second side 62 of the first semiconductor chip 70 includes a first contact region 71, a second contact region 72, and a third contact region 73. In one or more embodiments, the first contact region 71 and the third contact region 73 are coupled to a same region so as to form alternate contacts to the first semiconductor chip 70. For example, in one embodiment, the first contact region 71 and the third contact region 73 are both coupled to a same source region of a field effect transistor. In another embodiment, the first contact region 71 and the third contact region 73 are both coupled to a same emitter region of a transistor. In one or more embodiments, the second contact region 72 is coupled to a gate of a transistor. In alternative embodiments, the second contact region 72 is coupled to a base of a transistor.

A first interconnect 91 couples the second contact region 72, which is coupled to a gate/base region, to a first gate/base lead 51. A second interconnect 92 couples the third contact region 73, which is coupled to a source/emitter region, to a first source/emitter lead 53. Because of the larger currents drawn through the first source/emitter lead 53, the second interconnect 92 may comprise a thicker wire relative to the first interconnect 91 in some embodiments. A first drain/collector lead 52 is coupled to the first semiconductor chip 70 through the die paddle of the first leadframe 60. Thus, left to right on the page of the drawing along the direction D1, the first semiconductor device 10 has the first sequence of the first plurality of leads 50: the first gate/base lead 51, the first drain/collector lead 52, followed by the first source/emitter lead 53.

As illustrated in the top view of the second semiconductor device 110 illustrated in FIG. 3B, the second semiconductor chip 170 is disposed over a die paddle of a second leadframe 160. The second side 162 of the second semiconductor chip 170 includes a first contact pad region 171, a second contact pad region 172, and a third contact pad region 173. The phrase contact region in the first semiconductor device 10 is replaced with the phrase contact pad region for the second semiconductor device 110 to distinguish the corresponding regions in the Figures although both the regions may have similar functionality. In one or more embodiments, the first contact pad region 171 and the third contact pad region 173 are coupled to a same region so as to form alternate contacts to the second semiconductor chip 170. For example, in one embodiment, the first contact pad region 171 and the third contact pad region 173 are both coupled to a same source region of a field effect transistor. In another embodiment, the first contact pad region 171 and the third contact pad region 173 are both coupled to a same emitter region of a transistor. In one or more embodiments, the second contact pad region 172 is coupled to a gate of a transistor. In alternative embodiments, the second contact pad region 172 is coupled to a base of a transistor.

A first interconnection 191 couples the second contact pad region 172, which is coupled to a gate/base region, to a second gate/base lead 151. A second interconnection 192 couples the first contact pad region 171, which is coupled to a source/emitter region, to a second source/emitter lead 153. Thus, the second interconnection 192 avoids contacting the first interconnection 191. The second interconnection 192 may be thicker than the first interconnection 191. A second drain/collector lead 152 is coupled to the second semiconductor chip 170 through the die paddle of the second leadframe 160. Thus, left to right on the page of the drawing along the direction D1, the second semiconductor device 110 has the second sequence of the second plurality of leads 150: the second source/emitter lead 153, the second drain/collector lead 152, followed by the second gate/base lead 151. In other words, the arrangement of the gate/base lead and the source/emitter lead is exactly opposite between the first semiconductor device 10 and the second semiconductor device 110.

FIG. 4, which includes FIGS. 4A-4D, illustrates sectional top view of the semiconductor devices illustrated in FIG. 1 in accordance with an alternative embodiment of the invention, wherein FIGS. 4A and 4B illustrate a first embodiment and wherein FIGS. 4C and 4D illustrate a second embodiment.

As illustrated in FIGS. 4A and 4B, a single common contact region replaces the two contact regions on the semiconductor chips. Thus, interconnects may be coupled at different locations while still avoiding any shorting. Referring to FIG. 4A, the first gate/base lead 51 is coupled to the second contact region 72 through a first interconnect 91 while the first source/emitter 53 is coupled to the first contact region 71. Similarly, the second gate/base lead 151 is coupled to the second contact pad region 172 through a first interconnection 191 while the second source/emitter 153 is coupled to the first contact pad region 171 using a second interconnection 192. However, the location of the second interconnect 92 is different from the location of the second interconnection 192 to prevent crossing and/or shorting of the interconnects.

In some embodiments, the locations and shape of the contact regions on the active regions may be changed as illustrated in FIGS. 4C and 4D. For example, in FIG. 4D, the second contact pad region 172 is positioned differently from the second contact region 72. Similarly, in FIG. 4D, the first contact pad region 171 has a different shape from the first contact region 71.

As will be described using FIGS. 5-7, embodiments of the invention may be used to form semiconductor modules and semiconductor components comprising the semiconductor devices described in various embodiments.

Figure 5A:
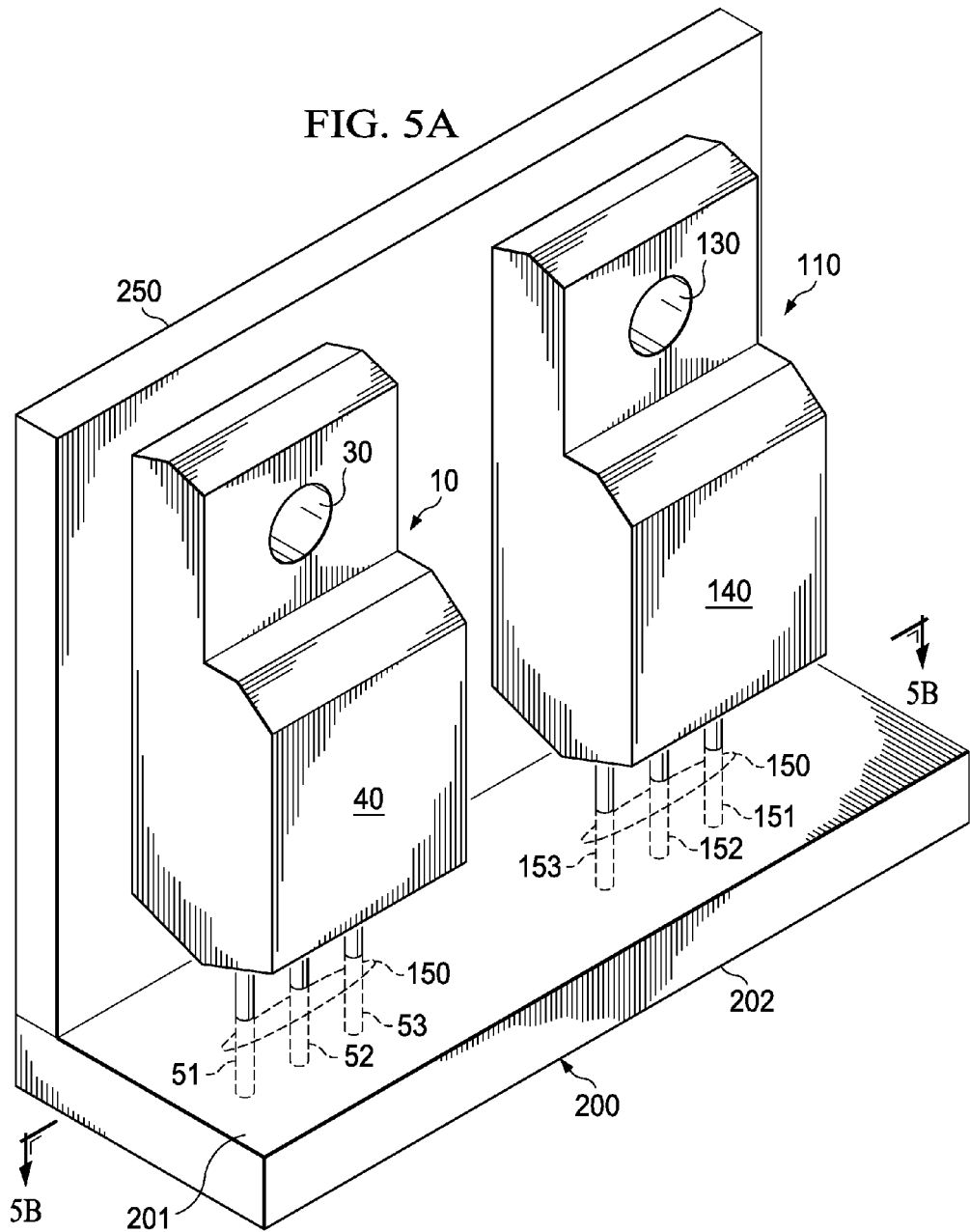
Figure 5B:
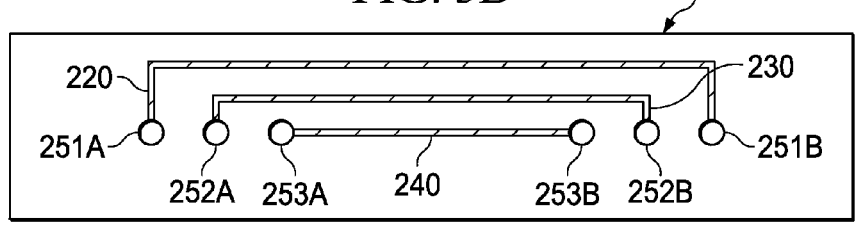

FIG. 5, which includes FIGS. 5A and 5B, illustrates a semiconductor module in accordance with an embodiment of the invention, wherein FIG. 5A illustrates a projection view while FIG. 5B illustrates a top cross-sectional view through a circuit board.

Referring to FIG. 5A, the first semiconductor device 10 and the second semiconductor device 110 described in prior embodiments, may be mounted onto a circuit board 200. The circuit board 200 may comprise mounting holes into which the first semiconductor device 10 and the second semiconductor device 110 are inserted. A heatsink 250 may be mounted below the first semiconductor device 10 and the second semiconductor device 110. The heatsink 250 may be commonly shared in one embodiment.

The first plurality of leads 50 and the second plurality of leads 150 may be inserted completely through the first side 201 of the circuit board 200 and soldered from the second side 202 of the circuit board. The circuit board 200 may include a redistribution layer 210, which may be adjacent the second side 202 in one embodiment. In another embodiment, the redistribution layer 210 may be adjacent the first side 201 or may be disposed within the circuit board 200 in another embodiment.

As illustrated in FIG. 5B, the first gate/base lead 51 is inserted into a first board opening 251A, the first drain/collector lead 52 is inserted into a second board opening 252A, the first source/emitter lead 53 is inserted into a third board opening 253A. Similarly, the second gate/base lead 151 is inserted into a fourth board opening 251B, the second drain/collector lead 152 is inserted into a fifth board opening 252B, the second source/emitter lead 153 is inserted into a sixth board opening 253B.

As illustrated in FIG. 5B, the first board opening 251A is coupled to the sixth board opening 251B through a first metal line 220, the second board opening 252A is coupled to the fifth board opening 252B through a second metal line 230, and the third board opening 253A is coupled to the fourth board opening 253B through a third metal line 240.

Advantageously, in various embodiments, the first metal line 220, the second metal line 230, and the third metal line 240 are formed in a same metal level. In contrast, if the arrangement of leads in the first semiconductor device 10 and the second semiconductor device 110 were identical, then at least one metal line has to be formed in a different metal level to avoid shorting. Consequently, in conventional designs, the circuit board has to include at least two metal levels. Thus, embodiments of the invention allow the use of a simpler and therefore cheaper circuit board 200.

Figure 6A:
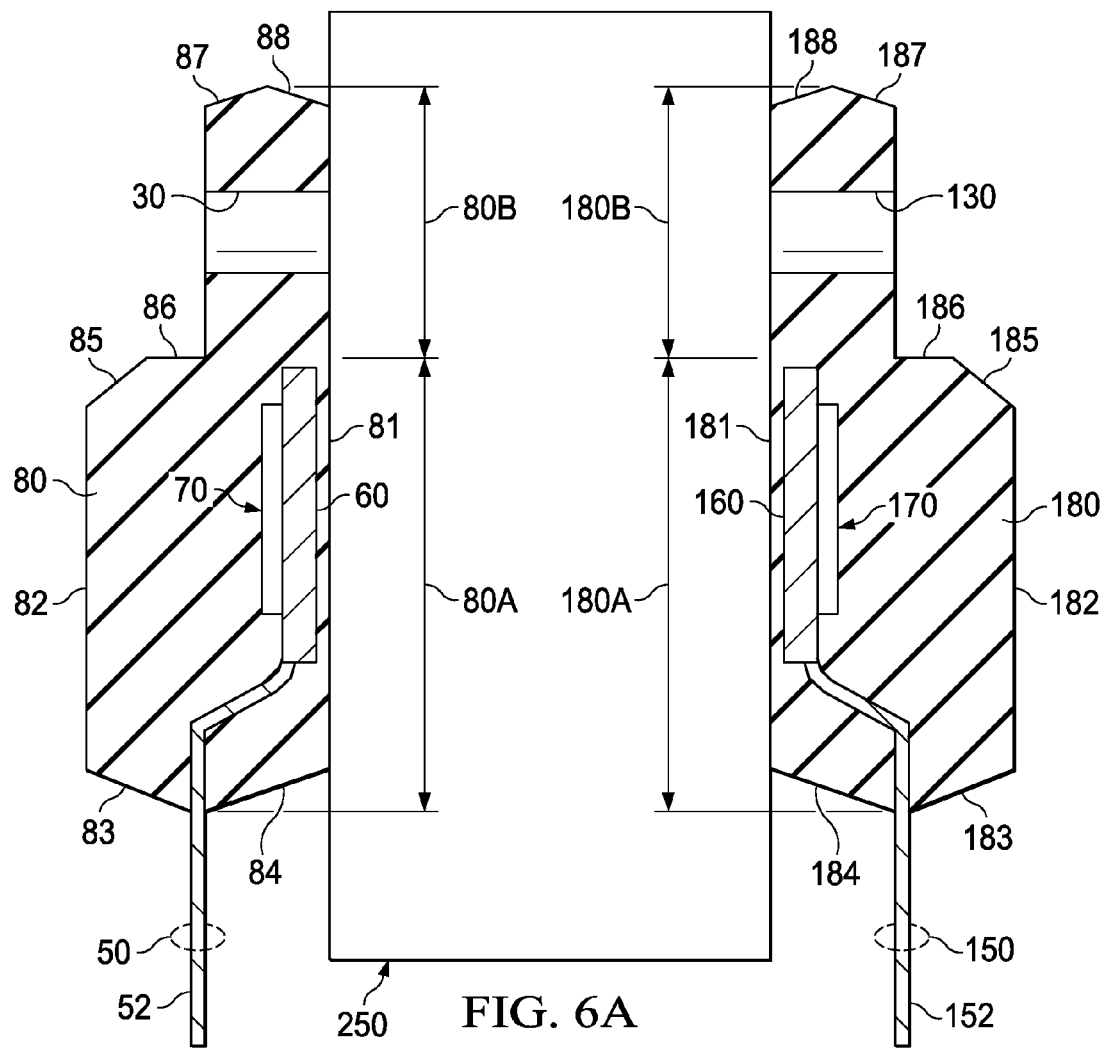
Figure 6B:
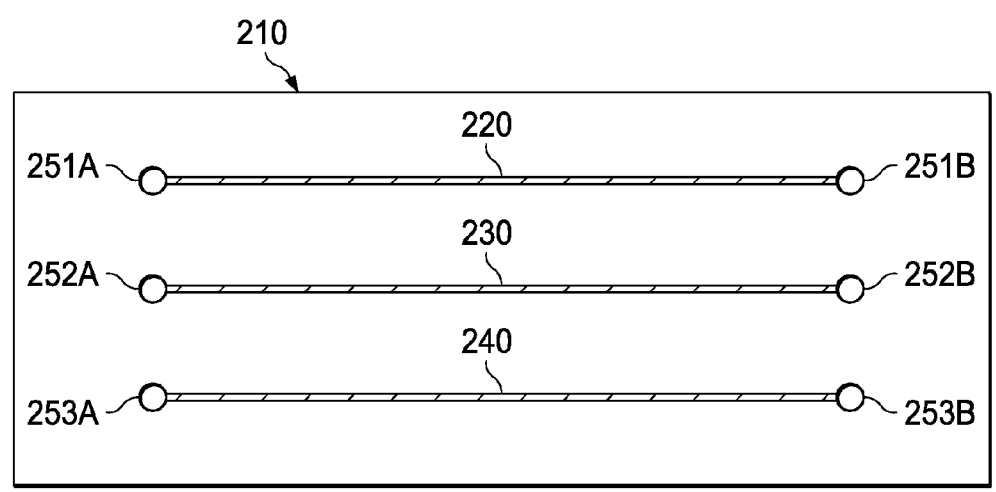

FIG. 6, which includes FIGS. 6A and 6B, illustrates a semiconductor module in accordance with an embodiment of the invention, wherein FIG. 6A illustrates a sectional side view while FIG. 6B illustrates a top cross-sectional view through a circuit board.

This embodiment illustrates a back-to-back mounting of the semiconductor devices allowing efficient packaging. A common heatsink 250 is used to remove heat from both a first semiconductor device 10 and a second semiconductor device 110. As described in prior embodiments, the arrangement of leads in the first plurality of leads 50 is opposite to the arrangement of leads in the second plurality of leads 150. Therefore, when mounted back-to-back as illustrated in FIG. 6A, the first plurality of leads 50 overlap with the second plurality of leads 150. In one or more embodiments, a portion of the first gate/base lead 51 overlaps with a portion of the second gate/base lead 151, a portion of the second drain/collector lead 52 overlaps with a portion of the second drain/collector lead 152, and a portion of the third source/emitter lead 53 overlaps with a portion of the third source/emitter lead 153.

As illustrated in FIG. 6B, the first gate/base lead 51 may be inserted into the first board opening 251A, the first drain/collector lead 52 may be inserted into the second board opening 252A, the first source/emitter lead 53 may be inserted into the third board opening 253A. Similarly, the second gate/base lead 151 may be inserted into the fourth board opening 251B, the second drain/collector lead 152 may be inserted into the fifth board opening 252B, and the second source/emitter lead 153 may be inserted into the sixth board opening 253B.

Advantageously, because the first gate/base lead 51 overlaps with the second gate/base lead 151, a straight metal line may be used to connect the leads in the circuit board 200. A first metal line 220 is coupled between the first gate/base lead 51 with the second gate/base lead 151. Similarly, a second metal line 230 is coupled between the first drain/collector lead 52 with the second drain/collector lead 152, and a third metal line 240 is coupled between the first source/emitter lead 53 with the second source/emitter lead 153. The first metal line 220, the second metal line 230, and the third metal line 240 are disposed in a same dielectric layer and they may be formed within a same metal level. Thus, the first semiconductor device 10 and the second semiconductor device 110 may be coupled together in parallel without adding a multiple metal level printed circuit board. Further, the parallelism is obtained without adding differential parasitic elements within the leads.

Figure 7A:
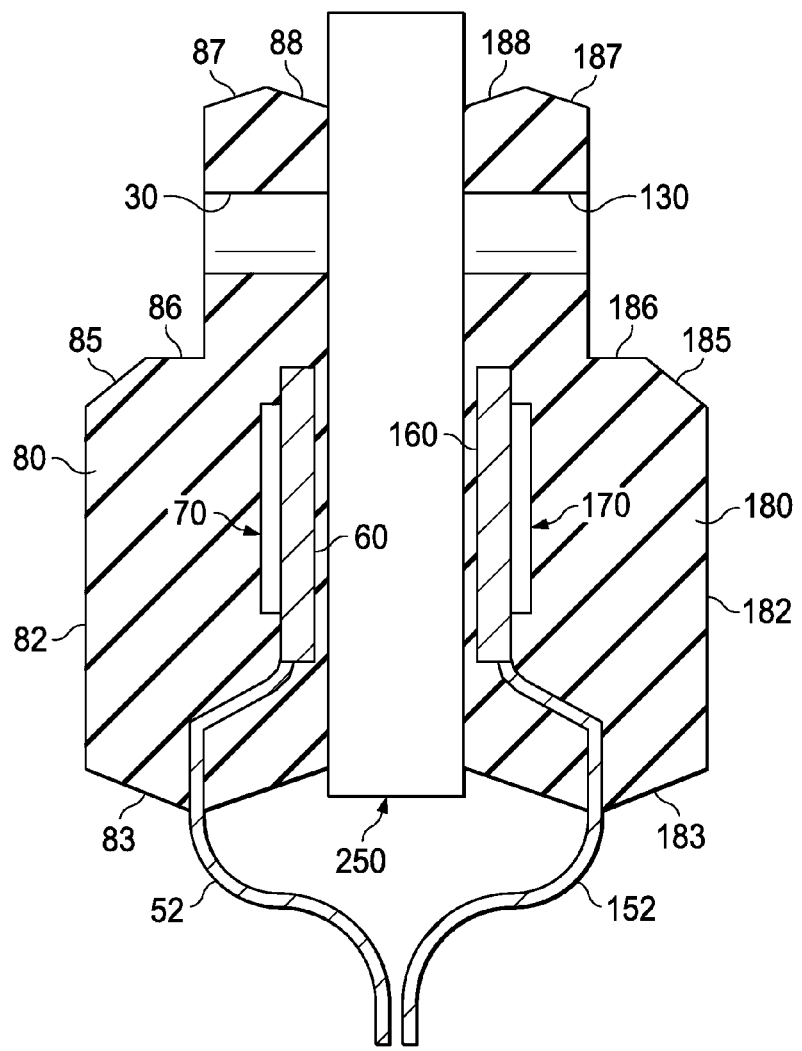
Figure 7B:
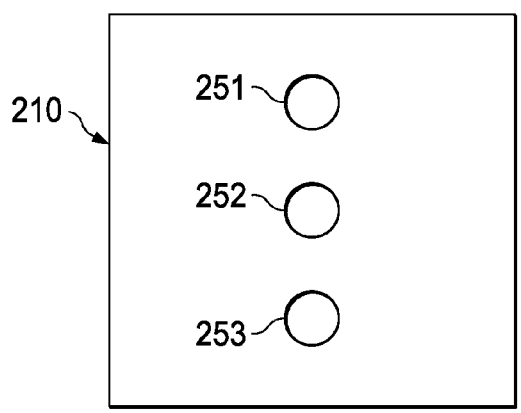

FIG. 7, which includes FIGS. 7A and 7B, illustrates a semiconductor module in accordance with an embodiment of the invention, wherein FIG. 7A illustrates a side sectional view while FIG. 7B illustrates a top cross-sectional view through a circuit board.

In an alternative embodiment, the first plurality of leads 50 and the second plurality of leads 150 may be joined together and mounted into the same opening of a circuit board 200. As in prior embodiments, the first semiconductor device 10 and the second semiconductor device 110 may be mounted in a back-to-back configuration with a common heatsink 250. As illustrated in FIGS. 7A and 7B, the first gate/base lead 51 and the second gate/base lead 151 may be mounted into the first board opening 251. Similarly, the first drain/collector lead 52 and the second drain/collector lead 152 may be mounted into the second board opening 252, and the first source/emitter lead 53 and the second source/emitter lead 153 may be mounted into the third board opening 253.

Thus, one or more discrete transistors may be interconnected using the circuit board 200. Consequently, embodiments of the invention enable circuit level integration of discrete components opening up the possibility of forming packages having multiple discrete devices using smaller discrete packages. For example, a single package comprising two discrete transistors may be replaced with the module illustrated in FIG. 5-7 in which two separate packages each having one discrete transistor may be interconnected at the circuit board 200.

FIG. 8-15 illustrates various stages of fabricating a plurality of semiconductor devices in accordance with embodiments of the invention.

Figure 8:
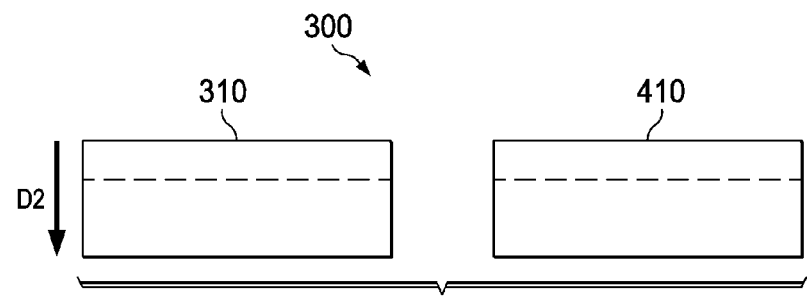

Referring to FIG. 8, a substrate 300 comprising a first active region 310 and a second active region 410 (dashed lines) is formed. In one or more embodiments, the first active region 310 and the second active may be formed in separate substrates. In one embodiment, the first active region 310 and the second active region 410 comprise one or more doped regions. The first and the second active regions 310 and 410 are similarly doped in various embodiments to form similar devices. In one or more embodiments, the first and the second active regions 310 and 410 form a vertical semiconductor device having vertical flow of current.

In various embodiments, the first and the second active regions 310 and 410 may be formed on a silicon substrate, or other wide band gap semiconductor material substrates such as SiC, GaN, GaAs, SbAs, AlN, CdSe, CdTe, ZnO, ZnS, and others. One or more embodiments of the invention may include devices formed on compound semiconductor substrates and may also include devices on hetero-epitaxial substrates. Alternatively, the first and the second active regions 310 and 410 may be formed at least partially on GaN, which may be a GaN on sapphire or silicon substrate.

In various embodiments, the first and the second active regions 310 and 410 form part of a power semiconductor device, which may be a discrete device in one embodiment.

Figure 9:
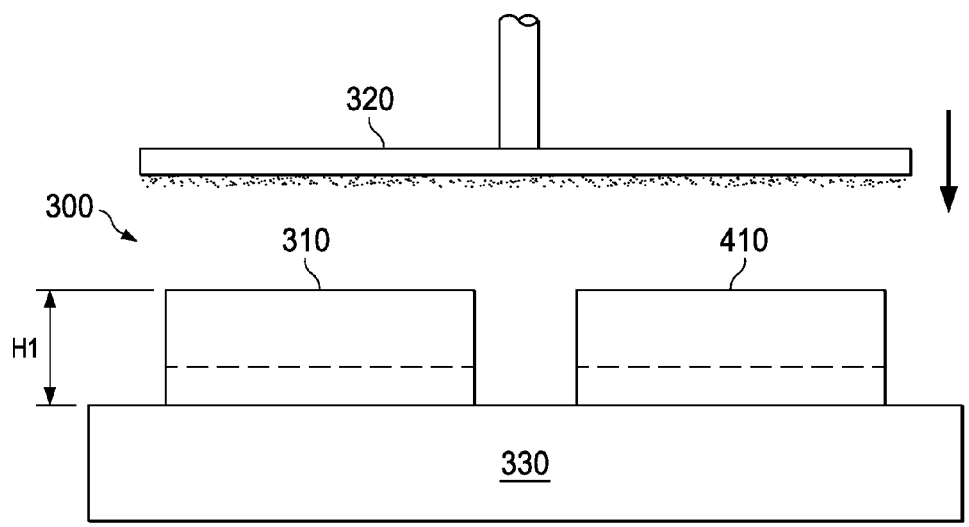

Referring to FIG. 9, the substrate 300 is placed over a carrier 330 such that the first active region 310 and the second active region 410 are adjacent the carrier 330. The carrier 330 may be physically attached to the substrate 300 using an adhesive in one embodiment. The substrate 300 is thinned down from a first thickness H1. The thinning may be performed mechanically, chemically, or using a combination thereof. In one embodiment, the thinning may be performed using a grinding tool 320. The thinning may be stopped after reaching the first active region 310 and the second active region 410.

Figure 10:
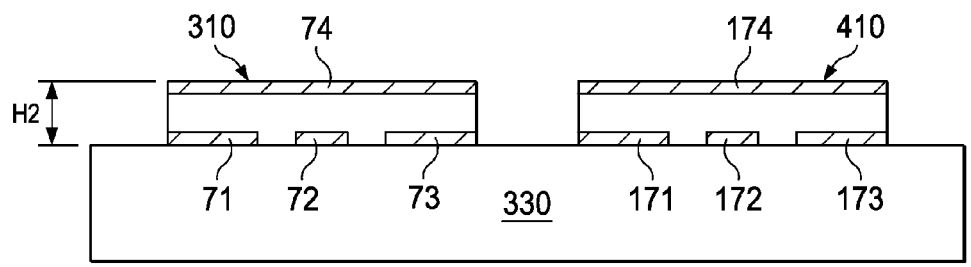

FIG. 10 illustrates the semiconductor devices after the thinning process. FIG. 10 is magnified along the depth of the device relative to FIG. 9 so as to better illustrate the active regions.

Referring to FIG. 10, contact regions are formed on the exposed active regions after the thinning. The thickness of the semiconductor devices corresponds to a second thickness H2, which is less than the first thickness H1 of FIG. 9, after the thinning.

The first active region 310 includes a first contact region 71, a second contact region 72, and a third contact region 74, which may have been formed previously. A fourth contact region 74 may be formed over the exposed first active region 310.

Similarly, the second active region 410 includes a first contact pad region 171, a second contact pad region 172, and a third contact pad region 174, which may have been formed previously. A fourth contact pad region 174 may be formed over the exposed second active region 410.

Figure 11A:
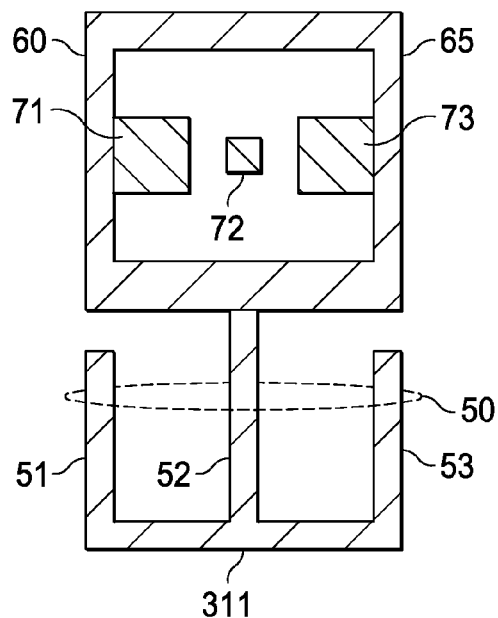
Figure 11B:
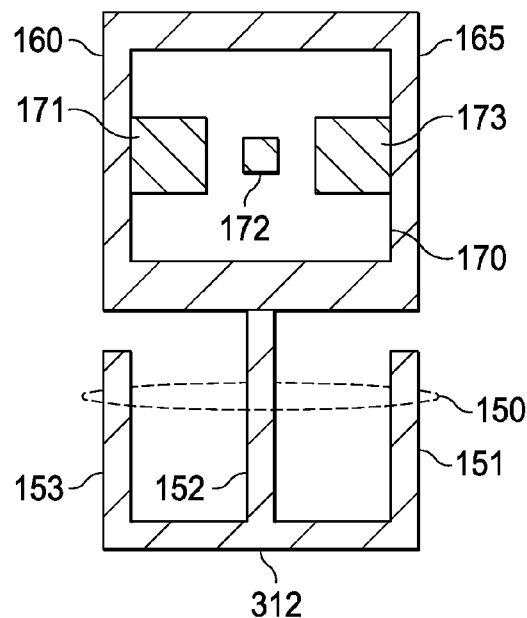

FIG. 11, which includes FIGS. 11A and 11B, illustrates a top sectional view after placing the semiconductor devices in leadframes in accordance with an embodiment of the invention.

Referring to FIG. 11A, the first semiconductor chip 70 is placed within a first leadframe 60 while the second semiconductor chip 170 is placed within a second leadframe 160.

The first leadframe 60 comprises a first die attach 65 and a first plurality of leads 50 while the second leadframe 160 comprises a second die attach 165 and a second plurality of leads 150. In one or more embodiments, the first plurality of leads 50 may comprise a first gate/base lead 51, a first drain/collector lead 52, and a first source/emitter lead 53. In one or more embodiments, the second plurality of leads 150 may comprise a second gate/base lead 151, a second drain/collector lead 152, and a second source/emitter lead 153.

The leads of the first and the second plurality of leads 50 and 150 may be connected to provide mechanical stability during processing. For example, a first connecting member 311 may be used to maintain together the first plurality of leads 50 while a second connecting member 312 may be used to keep together the second plurality of leads 150.

Figure 12A:
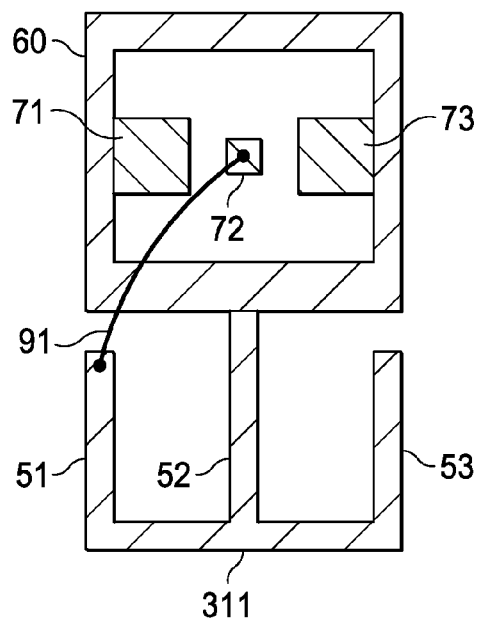
Figure 12B:
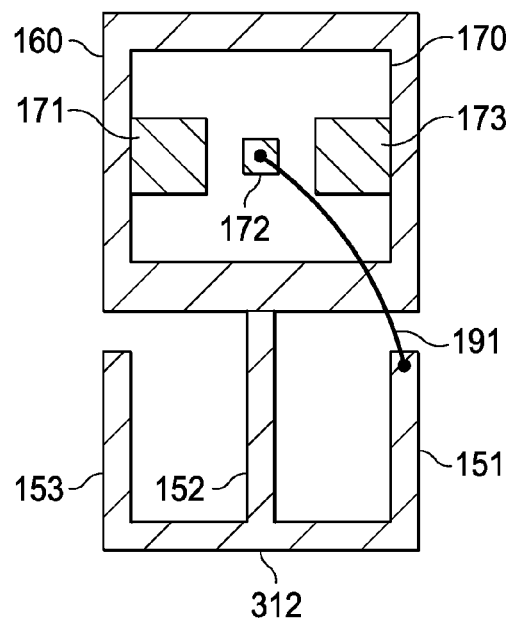

FIG. 12, which includes FIGS. 12A and 12B, illustrates sectional top view of the semiconductor devices after a first wirebonding process in accordance with an embodiment of the invention.

As illustrated in FIG. 12, a first interconnect 91 is coupled between the second contact region 72 and the first gate/base lead 51. The first interconnect 91 may comprise a wire bond in one embodiment. In another embodiment, the first interconnect 91 may be other types of interconnects such as clips, metal strips, and others. Similarly, as illustrated in FIG. 12B, a first interconnection 191 is coupled between the second contact pad region 172 and the second gate/base lead 151. The first interconnection 191 may comprise a wire bond in one embodiment. In another embodiment, the first interconnection 91 may be other types of interconnects such as clips, metal strips, and others.

As illustrated in FIGS. 12A and 12B, the first contact region 72, which is coupled to a gate/base region of a transistor, is coupled to the lead on the left of the page of the drawing while the first contact pad region 172, which is also coupled to a gate/base region of a transistor, is coupled to the lead on the right of the page. Thus, the sequence of the leads in the second plurality of leads 150 is reversed relative to the sequence of the leads in the first plurality of leads 50.

Figure 13A:
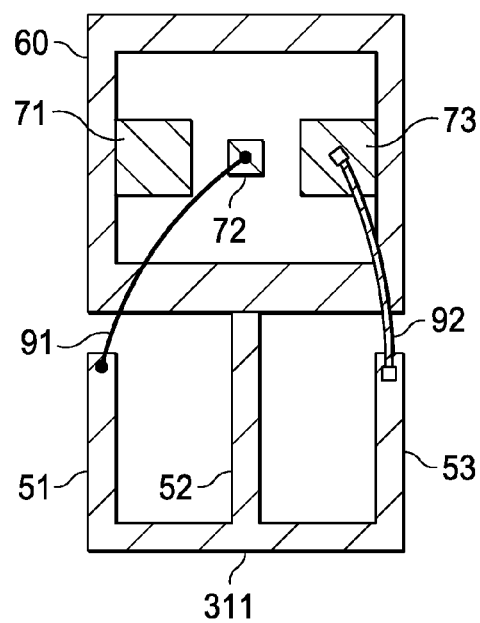
Figure 13B:
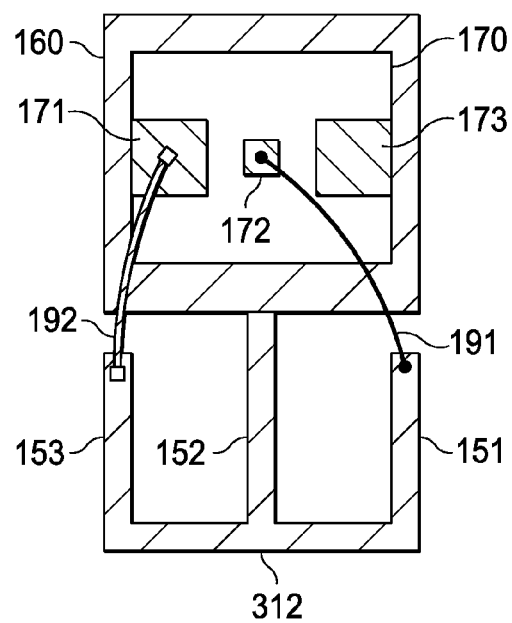

FIG. 13, which includes FIGS. 13A and 13B, illustrates a sectional top view of the semiconductor devices after a second wirebonding process in accordance with an embodiment of the invention.

As illustrated in FIG. 13A, a second interconnect 92 is coupled between the third contact region 73 and the first source/emitter lead 53. The second interconnect 92 may comprise a wire bond in one embodiment. In another embodiment, the second interconnect 92 may be other types of interconnects such as clips, metal strips, and others. Similarly, as illustrated in FIG. 13B, a second interconnection 192 is coupled between the third contact pad region 173 and the second source/emitter lead 153. The second interconnection 192 may comprise a wire bond in one embodiment. In another embodiment, the second interconnection 192 may be other types of interconnects such as clips, metal strips, and others.

FIG. 14, which includes FIGS. 14A and 14B, illustrates a cross-sectional view after encapsulating the semiconductor devices in accordance with an embodiment of the invention.

Referring to FIGS. 14A and 14B, a first encapsulant 80 is formed around the first semiconductor chip 70 and a second encapsulant 180 is formed around the second semiconductor chip 170.

In one or more embodiments, the encapsulating material is applied using a compression molding process. In compression molding, the encapsulating material may be placed into a molding cavity, then the molding cavity is closed to compress the encapsulating material. Compression molding may be used when a single pattern is being molded. As illustrated in FIG. 14A, the first leadframe 60 with the first semiconductor chip 70 is placed within a first molding tool 350A having a first mold cavity. Similarly, as illustrated in FIG. 14B, the second leadframe 160 with the second semiconductor chip 170 is placed within a second molding tool 350B. The encapsulating material may be introduced into the first molding tool 350A and the second molding tool 350B. The first molding tool 350A and the second molding tool 350B may be used to compress the encapsulant material in one embodiment.

In an alternative embodiment, the encapsulating material is applied using a transfer molding process. In other embodiments, the encapsulating material may be applied using injection molding, granulate molding, powder molding, or liquid molding. Alternatively, the encapsulating material may be applied using printing processes such as stencil or screen printing.

In various embodiments, the encapsulating material comprises a dielectric material and may comprise a mold compound in one embodiment. In other embodiments, the encapsulating material may comprise a polymer, a biopolymer, a fiber impregnated polymer (e.g., carbon or glass fibers in a resin), a particle filled polymer, and other organic materials. In one or more embodiments, the encapsulating material comprises a sealant not formed using a mold compound, and materials such as epoxy resins and/or silicones. In various embodiments, the encapsulating material may be made of any appropriate duroplastic, thermoplastic, or thermosetting material, or a laminate. The material of the encapsulating material may include filler materials in some embodiments. In one embodiment, the encapsulating material may comprise epoxy material and a fill material comprising small particles of glass or other electrically insulating mineral filler materials like alumina or organic fill materials.

Figure 15:
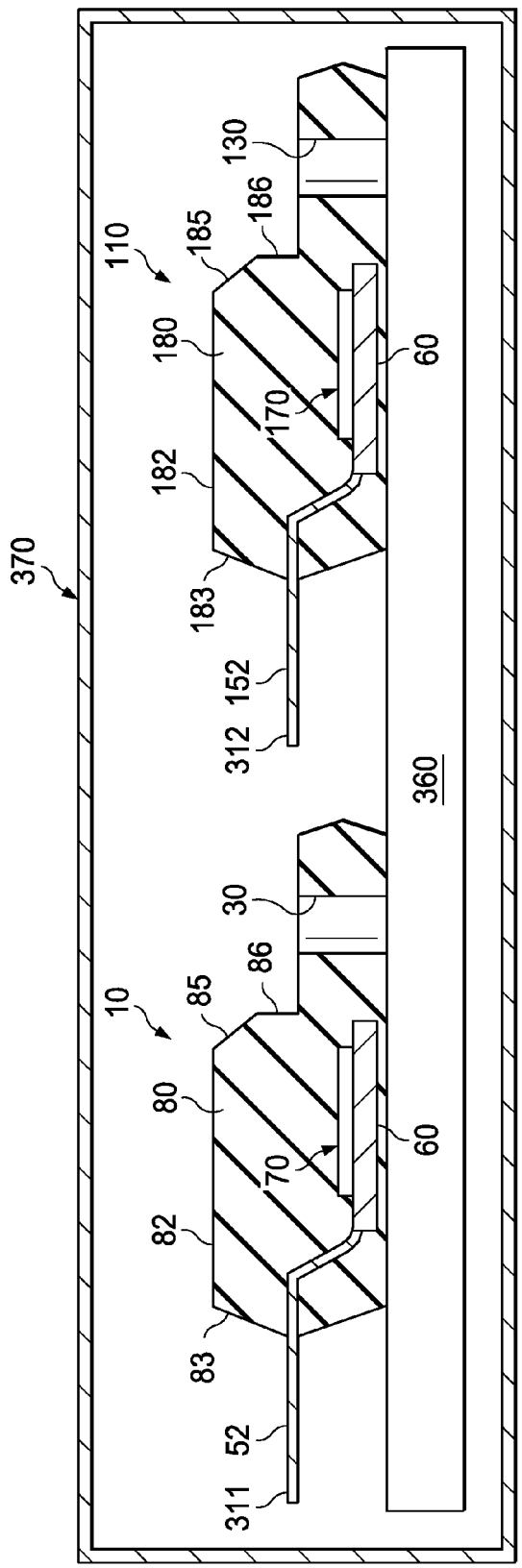

FIG. 15 illustrates the semiconductor devices after being removed from the molding tools in accordance with an embodiment.

The encapsulating material deposited previously may be cured, i.e., subjected to a thermal process to harden so as to form a hermetic seal protecting the semiconductor chip. The curing process hardens the encapsulating material thereby forming a single substrate comprising a first encapsulant 80 holding the first leadframe 60 and the first semiconductor chip 70 and another substrate comprising a second encapsulant 180 holding the second leadframe 160 and the second semiconductor chip 170.

To avoid shorting between the pins, the first semiconductor device 10 that is being formed and the second semiconductor device 110 that is being formed may be removed from the molding tools and may be placed over a supporting structure 360. In one embodiment, the first and the second semiconductor devices 10 and 110 may be annealed to cure the encapsulating material to form a first encapsulant 80 and a second encapsulant 180. In one embodiment, the curing may be performed simultaneously, for example, in a same lot. In another embodiment, the curing may be performed in a same anneal chamber, for example, the first semiconductor device 10 may be placed within the annealing unit 370 and then the second semiconductor device 110 may be annealed within the annealing unit 370. In various embodiments, the curing may be performed at below 350° C., and in between about 250° C. to about 300° C. in one embodiment. In The first and the second connecting members 311 and 312 (also illustrated previously in FIG. 13) may be removed (e.g., mechanically using a saw) to form the first semiconductor device 10 and the second semiconductor device 110 illustrated in FIGS. 1-3 and/or FIG. 4.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 1 may be combined with the embodiments described in FIG. 4-7. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor module comprising:
   a first semiconductor device having a first plurality of leads including a first gate/base lead, a first drain/collector lead, and a first source/emitter lead;
   a second semiconductor device having a second plurality of leads including a second gate/base lead, a second drain/collector lead, and a second source/emitter lead; and
   a circuit board having a plurality of mounting holes, wherein each of the first plurality of leads and the second plurality of leads is mounted into a respective one of the plurality of mounting holes, wherein, at the plurality of mounting holes, a first distance from the first gate/base lead to the second gate/base lead is different from a second distance from the first source/emitter lead to the second source/emitter lead.

2. The semiconductor module according to claim 1, wherein the first gate/base lead is electrically coupled to the second gate/base lead, wherein the first source/emitter lead is electrically coupled to the second source/emitter lead, and wherein the first drain/collector lead is coupled to the second drain/collector lead.

3. The semiconductor module according to claim 1, wherein a third distance between the first drain/collector lead and the second drain/collector lead at the plurality of mounting holes is different from the first distance.

4. The semiconductor module according to claim 3, wherein the third distance is different from the second distance.

5. The semiconductor module according to claim 1, wherein the first source/emitter lead is adjacent to the second source/emitter lead, and wherein the first distance is larger than the second distance.

6. The semiconductor module according to claim 1, further comprising a redistribution layer disposed in the circuit board, the redistribution layer comprising a first metal line coupling the first gate/base lead to the second gate/base lead, a second metal line coupling the first drain/collector lead to the second drain/collector lead, and a third metal line coupling the first source/emitter lead to the second source/emitter lead.

7. The semiconductor module according to claim 6, wherein the first metal line, the second metal line, and the third metal line are disposed in the same vertical metal level in the redistribution layer.

8. The semiconductor module according to claim 1, further comprising a heat sink disposed below the first semiconductor device and the second semiconductor device.

9. A semiconductor module comprising:
   a first semiconductor device comprising a first discrete component and having a first plurality of leads arranged in a first sequence, the first plurality of leads comprising a first gate/base lead; and
   a second semiconductor device comprising a second discrete component and having a second plurality of leads arranged in a second sequence, the second plurality of leads comprising a second gate/base lead, wherein a location of the first gate/base lead in the first sequence is different from a location of the second gate/base lead in the second sequence, and wherein the first semiconductor device and the second semiconductor device comprise substantially the same package dimensions.

10. The semiconductor module according to claim 9, wherein the first semiconductor device and the second semiconductor device are coupled in parallel through a circuit board.

11. The semiconductor module according to claim 9, wherein the first discrete component comprises a discrete insulated gate bipolar transistor, and wherein the second discrete component also comprises a discrete insulated gate bipolar transistor.

12. The semiconductor module according to claim 9, wherein the first discrete component comprises a discrete metal insulator field effect transistor, and wherein the second discrete component also comprises a discrete metal insulator field effect transistor.

13. The semiconductor module according to claim 9, wherein the first sequence comprises the first gate/base lead, followed by a first drain/collector lead, followed by a first source/emitter lead, and wherein the second sequence comprises a second source/emitter lead, followed by a second drain/collector lead, followed by a second gate/base lead.

14. The semiconductor module according to claim 9, wherein the first sequence comprises the first gate/base lead, followed by a first drain/collector lead, followed by a first source/emitter lead, and wherein the second sequence comprises a second source/emitter lead, followed by a second gate/base lead, and followed by a second drain/collector lead.

15. The semiconductor module according to claim 9, wherein the first sequence comprises the first gate/base lead, followed by a first drain/collector lead, followed by a first source/emitter lead, and wherein the second sequence comprises a second drain/collector lead, followed by a second gate/base lead, and followed by a second source/emitter lead.

16. The semiconductor module according to claim 9, wherein the first sequence comprises the first gate/base lead, followed by a first drain/collector lead, followed by a first source/emitter lead, and wherein the second sequence comprises a second drain/collector lead, followed by a second source/emitter lead, and followed by a second gate/base lead.

17. The semiconductor module according to claim 9, further comprising:
   a first plurality of discrete semiconductor devices having a plurality of leads arranged in the first sequence; and
   a second plurality of discrete semiconductor devices having a plurality of leads arranged in the second sequence.

18. A semiconductor module comprising:
- a first semiconductor device comprising a first discrete component and having a first plurality of leads arranged in a first sequence, wherein the first sequence comprises a first gate/base lead, a first drain/collector lead, and a first source/emitter lead;
- a second semiconductor device comprising a second discrete component and having a second plurality of leads arranged in a second sequence different from the first sequence, wherein the second sequence comprises a second drain/collector lead, a second gate/base lead, and a second source/emitter lead, and wherein the first semiconductor device and the second semiconductor device comprise substantially the same package dimensions; and
- a common heat sink disposed under the first semiconductor device and the second semiconductor device.

19. The semiconductor module according to claim 18, wherein the first sequence comprises the first gate/base lead, followed by the first drain/collector lead, followed by the first source/emitter lead, and wherein the second sequence comprises the second drain/collector lead, followed by the second source/emitter lead, and followed by the second gate/base lead.

20. The semiconductor module according to claim 18, wherein a location of the first gate/base lead in the first sequence is different from a location of the second gate/base lead in the second sequence.

21. The semiconductor module according to claim 18, wherein the first semiconductor device and the second semiconductor device are coupled in parallel through a circuit board.

22. The semiconductor module according to claim 18, further comprising a redistribution layer disposed in the circuit board, the redistribution layer comprising a first metal line coupling the first gate/base lead to the second gate/base lead, a second metal line coupling the first drain/collector lead to the second drain/collector lead, and a third metal line coupling the first source/emitter lead to the second source/emitter lead.

23. The semiconductor module according to claim 21, wherein the first metal line, the second metal line, and the third metal line are disposed in the same vertical metal level in the redistribution layer.

* * * * *